(12) United States Patent
Osumi

(10) Patent No.: US 8,269,335 B2
(45) Date of Patent: Sep. 18, 2012

(54) MULTILAYER SEMICONDUCTOR DEVICE AND ELECTRONIC EQUIPMENT

(75) Inventor: Takatoshi Osumi, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/008,579

(22) Filed: Jan. 18, 2011

(65) Prior Publication Data

US 2011/0115081 A1      May 19, 2011

Related U.S. Application Data

(63) Continuation of application No. PCT/JP2009/003134, filed on Jul. 6, 2009.

(30) Foreign Application Priority Data

Oct. 21, 2008   (JP) ................................. 2008-270414

(51) Int. Cl.
    *H01L 23/48* (2006.01)
(52) U.S. Cl. ....................................... 257/697; 257/693
(58) Field of Classification Search .................. 257/686, 257/777, 698, 697, 693
    See application file for complete search history.

(56) References Cited

U.S. PATENT DOCUMENTS

| | | | |
|---|---|---|---|
| 6,472,735 B2 * | 10/2002 | Isaak .............................. | 257/686 |
| 6,501,165 B1 | 12/2002 | Farnworth et al. | |
| 7,843,059 B2 * | 11/2010 | Gomyo et al. ................. | 257/723 |
| 7,863,735 B1 * | 1/2011 | Cho et al. ....................... | 257/723 |
| 7,928,552 B1 * | 4/2011 | Cho et al. ....................... | 257/686 |
| 2004/0159925 A1 | 8/2004 | Matsuura et al. | |
| 2005/0184377 A1 * | 8/2005 | Takeuchi et al. .............. | 257/686 |
| 2007/0096334 A1 | 5/2007 | Kawabata et al. | |
| 2007/0241463 A1 | 10/2007 | Yamaguchi et al. | |
| 2008/0108179 A1 | 5/2008 | Mistry et al. | |
| 2008/0142940 A1 * | 6/2008 | Dunne ........................... | 257/686 |
| 2008/0157330 A1 | 7/2008 | Kroehnert et al. | |
| 2008/0169550 A1 | 7/2008 | Kurita | |
| 2009/0008765 A1 | 1/2009 | Yamano et al. | |

FOREIGN PATENT DOCUMENTS

| | | |
|---|---|---|
| JP | 2004-253518 | 9/2004 |
| JP | 2007-123520 | 5/2007 |
| JP | 2007-281129 A | 10/2007 |
| JP | 2007-287762 | 11/2007 |
| JP | 2007-287762 A | 11/2007 |
| JP | 2007-287906 | 11/2007 |
| WO | WO 2007/069606 A1 | 6/2007 |

* cited by examiner

*Primary Examiner* — S. V. Clark
(74) *Attorney, Agent, or Firm* — McDermott Will & Emery LLP

(57) ABSTRACT

A multilayer semiconductor device includes an interconnect substrate provided with first electrode lands and connection terminals on a top surface; a semiconductor chip mounted on the top surface of the interconnect substrate; first connecting members connecting the first electrode lands to a circuit formation surface of the semiconductor chip; first metal posts provided on the connection terminals; encapsulating resin filling a space between the interconnect substrate and the semiconductor chip; a package provided with second electrode lands on a main surface; and second connecting members electrically connecting the first metal posts to the second electrode lands.

6 Claims, 3 Drawing Sheets

(a)

(b)

(c)

MULTILAYER SEMICONDUCTOR DEVICE AND ELECTRONIC EQUIPMENT

CROSS-REFERENCE TO RELATED APPLICATION

This is a continuation of PCT International Application PCT/JP2009/003134 filed on Jul. 6, 2009, which claims priority to Japanese Patent Application No. 2008-270414 filed on Oct. 21, 2008. The disclosures of these applications including the specifications, the drawings, and the claims are hereby incorporated by reference in their entirety.

BACKGROUND

The present disclosure relates to multilayer semiconductor devices in which packages enclosing semiconductor chips are stacked and connected together.

In recent years, with progress in miniaturization and an increase in functions of information and communication equipments and office electronic equipments, miniaturization and an increase in the number of external terminals for input and output are required in semiconductor devices mounted in such equipments and including semiconductor integrated circuit devices etc. However, in a system in which a plurality of semiconductor devices are mounted on a same plane, semiconductor devices for mobile equipments particularly requiring miniaturization and a decease in thicknesses are difficult to manufacture.

As a technique for meeting such requirements, package-on-package (PoP) structures have been increasingly used, which are multilayer package structures with high integration. A conventional semiconductor device will be described below with reference to FIG. 3.

FIG. 3 is a cross-sectional view illustrating a conventional multilayer semiconductor device having a PoP structure. As shown in the figure, metal bumps 102, which are made of solder, and are mechanically and electrically connected to electrode terminals on a semiconductor chip 101, are formed on the semiconductor chip 101. The semiconductor chip 101 is flip-chip mounted on an interconnect substrate 103 with the metal bumps 102 interposed therebetween, and is mechanically and electrically connected to the interconnect substrate 103. Underfill resin 106 for encapsulating the metal bumps 102 fills a space between the semiconductor chip 101 and the interconnect substrate 103. External connection terminals 107 made of solder are formed on a surface (hereinafter referred to as a "bottom surface") of the interconnect substrate 103 opposite to a semiconductor chip mounting surface (hereinafter referred to as a "top surface"). Connection terminals 104 are arranged in regions in the top surface of the interconnect substrate 103, on which the semiconductor chip 101 is not mounted and which surround the semiconductor chip 101 when viewed from above. As such, a lower package is formed. A multilayer package 108 including electrode lands 109 on the bottom surface is mechanically and electrically connected to the top of the lower package via metal balls 110 made of solder. The metal balls 110 mechanically and electrically connect the connection terminals 104 to the electrode lands 109, and are electrically connected to the external connection terminals 107.

A method of manufacturing the flip-chip mounted multilayer semiconductor device will be described below.

First, the semiconductor chip 101, on which the metal bumps 102 are formed by electroplating, printing, ball mounting, etc., and the interconnect substrate 103, in which electrode lands are formed in positions corresponding to the metal bumps 102, are prepared. Then, the semiconductor chip 101 is flip-chip connected to the top of the interconnect substrate 103.

Next, the solder is melted by reflowing the metal bumps 102 of the semiconductor chip 101 so that the semiconductor chip 101 is connected to the interconnect substrate 103 by the metal bumps 102.

After that, the space between the semiconductor chip 101 and the interconnect substrate 103 is cleaned, and the underfill resin 106 is injected into the space with a dispenser. The resin is injected from a periphery of the semiconductor chip 101. The liquid resin enters the entire space between the semiconductor chip 101 and the interconnect substrate 103 due to capillary action so that the underfill resin 106 fills the space between the semiconductor chip 101 and the interconnect substrate 103.

Then, heat treatment is performed to cure the underfill resin 106, thereby encapsulating a circuit formation surface of the semiconductor chip 101 and the portions connected by the metal bumps 102.

Finally, the external connection terminals 107 are formed on metal pads extracted to the surface (bottom surface) of the interconnect substrate 103 opposite to the top surface (chip mounting surface), and then reflow is performed.

As such, a ball grid array (BGA) multilayer semiconductor device is completed.

SUMMARY

In the above-described conventional PoP structure, the thickness of the semiconductor chip 101 mounted on the lower package and the height of the metal bumps 102 are limited by the height of the metal balls 110 after being connected. When mounting the multilayer package 108, the connection terminals 104 in the lower package need to be exposed. Thus, a fillet of the underfill resin 106 filing the space between the semiconductor chip 101 and the interconnect substrate 103 cannot cover part or all of the connection terminals 104. As a result, the outer size of the semiconductor chip 101 is limited.

As a method of reliably providing standoff between the both packages (i.e., the space between the multilayer package 108 and the interconnect substrate 103), metal posts 105 are formed on the electrode lands 109 of the multilayer package 108 as shown in FIG. 4 (see, e.g., Japanese Patent Publication No. 2007-287906). In this structure, since the metal posts 105 are added, the standoff can be expanded as compared to the structure shown in FIG. 3. However, since the connection terminals 104 on the lower package need to be completely exposed when mounting the multilayer package 108, and the outer size of the semiconductor chip 101 remains limited.

Also, as shown in FIG. 5, there is a method of forming mold resin 111 to reduce the limitation on the outer size of a semiconductor chip 101 (see, e.g., United States Patent Publication No. 2008/0169550). With this structure, the mold resin 111 fills a space between the semiconductor chip 101 and an interconnect substrate 103 to function as underfill resin. There is thus no limitation on the outer size of the semiconductor chip 101 due to a fillet of the underfill resin. However, since a multilayer package 108 is connected to a lower package only by metal balls 110, the height of the metal balls 110 need to be reduced as much as possible when the height of the entire multilayer semiconductor device is reduced. This increases stress applied to the metal balls, thereby reducing reliability.

According to embodiments of the present disclosure, in a multilayer semiconductor device formed by stacking a plurality of packages, sufficient standoff between the packages can be reliably provided, and the limitations on the chip size can be reduced.

An example multilayer semiconductor device of the present disclosure includes an interconnect substrate provided with first electrode lands and connection terminals on a top surface; a semiconductor chip mounted on the top surface of the interconnect substrate with a circuit formation surface facing the interconnect substrate; first connecting members connecting the first electrode lands to the circuit formation surface of the semiconductor chip; first metal posts provided on the connection terminals, and in a region of the top surface of the interconnect substrate outside the semiconductor chip when viewed from above; encapsulating resin filling at least a space between the interconnect substrate and the semiconductor chip; a semiconductor device provided with second electrode lands on a main surface; and second connecting members electrically connecting the first metal posts to the second electrode lands.

In this structure, the first metal posts are provided on the connection terminals, thereby reliably providing sufficient standoff between the interconnect substrate and the semiconductor device. This reduces limitations on the height of the first connecting members and the thickness of the semiconductor chip to reduce damages of the semiconductor chip, etc. Also, when the encapsulating resin leaks to a region between the first metal posts from the space between the interconnect substrate and the semiconductor chip, electrical connection between the first metal posts and the second connecting members can be provided. This reduces the distance between the semiconductor chip and the first metal posts as compared to a conventional multilayer semiconductor device. Even when the sizes of the multilayer semiconductor devices are the same, the size of the semiconductor chip can be increased as compared to a conventional device.

An example multilayer semiconductor device of the present disclosure is used for various communication equipments such as mobile phones, and electronic equipments such as digital cameras.

As described above, in an example multilayer semiconductor device of the present disclosure, when a PoP structure is used, sufficient standoff can be reliably provided between an interconnect substrate and a semiconductor device, and limitations on a chip size can be largely reduced.

DETAILED DESCRIPTION

Embodiments of a multilayer semiconductor device according to the present disclosure will be described hereinafter in detail with reference to the drawings.

First Embodiment

Figure 1:
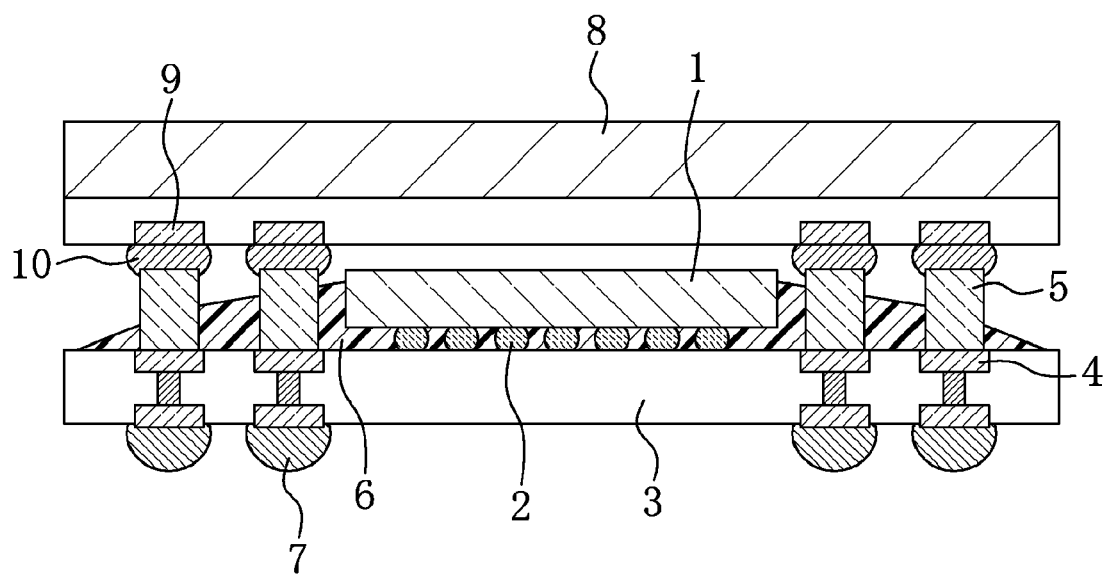
FIG. 1 is a cross-sectional view illustrating a multilayer semiconductor device according to a first embodiment of the present disclosure.

FIG. 1 is a cross-sectional view illustrating a multilayer semiconductor device according to a first embodiment of the present disclosure. As shown in the figure, the multilayer semiconductor device according to this embodiment includes an interconnect substrate 3 having a top surface and a bottom surface on which a plurality of connection terminals 4 are provided; a semiconductor chip 1 mounted on the top surface of the interconnect substrate 3 with a circuit formation surface facing the interconnect substrate 3; the metal posts 5 provided on the connection terminals 4 formed on the top surface of the interconnect substrate 3, and formed outside the semiconductor chip 1 when viewed from above, a multilayer package (semiconductor device) 8 provided with electrode lands 9 on a main surface, and mechanically and electrically connected to tops of the metal posts 5 via metal balls (second connecting members) 10 made of solder etc.; external connection terminals 7 made of solder etc. and provided on the connection terminals 4 formed on the bottom surface of the interconnect substrate 3; and underfill resin (encapsulating resin) 6 filling a space between the semiconductor chip 1 and the interconnect substrate 3 and encapsulating metal bumps (first connecting members) 2 made of solder etc. Lands formed on the top surface of the interconnect substrate 3 are connected to the circuit formation surface of the semiconductor chip 1 via metal bumps 2. The multilayer package 8 includes a semiconductor chip (not shown) different from the semiconductor chip 1.

A plurality of electrode pads made of aluminum (Al) are formed on the circuit formation surface of the semiconductor chip 1. A metal film, which includes a lower metal film formed by, e.g., sputtering and made of copper (Cu) and barrier metal of titanium (Ti), and an upper metal film formed on the lower metal film by electroplating and made of nickel (Ni), is formed on the electrode pads. The barrier metal may be TiW, Cr, etc. The metal film may be made of nickel (Ni/Au) formed by electroless plating. Furthermore, the above-descried metal bumps 2 are formed on the metal film.

The interconnect of the interconnect substrate 3 is made of copper (Cu). The electrode lands are formed by opening solder resist formed on the top surface of the interconnect substrate 3. The surfaces of the interconnect and the electrode lands are formed by a metal film made of nickel (Ni/Au) formed by electroless plating. Organic solder preservative (OSP) may be applied on the top surface of the interconnect substrate 3. Solder-on-pad (SOP) made of solder may be formed on the top surface of the interconnect substrate 3 by printing or mounting. The connection terminals 4, which correspond to the metal balls 10 formed on the electrode lands 9 of the multilayer package 8, are formed in outer regions of the top surface of the interconnect substrate 3, in which no electrode land is formed. The metal posts 5 are made of metal such as copper. The top surfaces of the metal posts 5 are preferably located higher than at least the upper ends of the metal bumps 2, and more preferably at the same height or higher than a back surface (i.e., the surface facing the circuit formation surface) of the semiconductor chip 1 after being mounted.

When forming the multilayer semiconductor device according to this embodiment, first, flux is transferred to tops of the metal bumps 2 with the circuit formation surface (main surface) of the semiconductor chip 1 facing downward. Alternately, the flux may be applied to the top surface of the interconnect substrate 3. Then, the semiconductor chip 1 is mounted on the top surface of the interconnect substrate 3 and heated in a reflow furnace, thereby melting the metal bumps 2 to connect the semiconductor chip 1 to the interconnect substrate 3. Next, in order to protect the connecting portion of the circuit formation surface of the semiconductor chip 1 and the metal bumps 2, the underfill resin 6 is applied to and fills the space between the semiconductor chip 1 and the interconnect substrate 3 from the outer periphery of the semiconductor chip 1 using a dispenser. At this time, the underfill resin 6 fills the periphery of the metal posts 5 without covering the top surfaces of the metal posts 5. Not the entire periphery of the spaces between the metal posts 5 need to be filled with the underfill resin 6, and some of the metal posts 5 may not be in contact with the underfill resin 6. That is, as shown in FIG. 1, part or whole of the side surface of each of the metal posts 5 may be exposed.

Next, the electrode lands 9 of the multilayer package 8 are mounted on a lower package. The "lower package" is a package including the interconnect substrate 3, the semiconductor chip 1, and the metal posts 5. In this process, the metal balls 10 provided on the electrode lands 9 and the metal posts 5 are aligned and in contact with each other, and then heat is applied to melt the metal balls 10, thereby connecting the metal balls 10 to the metal posts 5. As such, the multilayer semiconductor device according to this embodiment is manufactured. Note that the metal balls 10 may be provided at the side of the lower package in advance instead of the side of the multilayer package 8.

In the multilayer semiconductor device according to this embodiment, the metal posts 5 are provided on the connection terminals 4 at the top surface of the interconnect substrate 3. This reliably provides a sufficiently wide space (standoff) between the lower package and the multilayer package 8, and thus, there is no limitation on the height of the metal bumps 2 and the thickness of the semiconductor chip 1, thereby improving design flexibility. Accordingly, cracks of the semiconductor chip 1 and breaking of the metal bumps 2 can be reduced. Furthermore, since the metal posts 5 are provided, the underfill resin 6 leaking from the space between the interconnect substrate 3 and the semiconductor chip 1 does not cover the top surfaces of the metal posts 5, even when the size of the semiconductor chip 1 is large. Since the semiconductor chip 1 can be arranged near the metal posts 5, the ratio of the planar size of the semiconductor chip 1 to the planar size of the multilayer semiconductor device can be increased. Thus, even when the semiconductor chip 1 of the same size is used, the outer size of the multilayer semiconductor device can be reduced as compared to a conventional device. While the distance between the metal posts 5 and the semiconductor chip 1 can be reduced as compared to a conventional multilayer semiconductor device, the distance is preferably 0.1 mm or more for convenience of manufacture.

Second Embodiment

Figure 2:
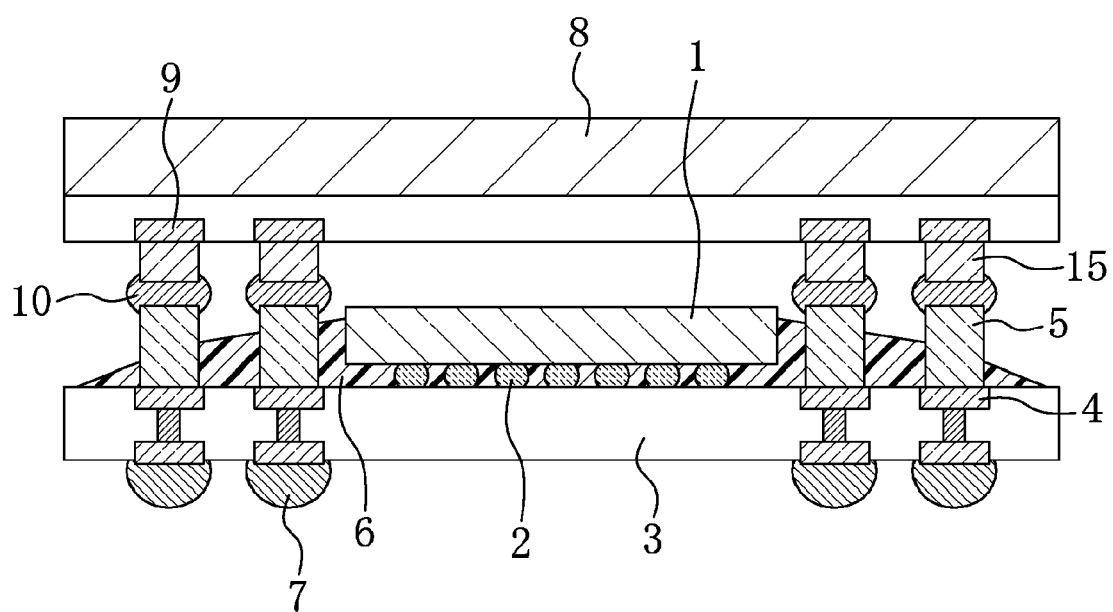
FIG. 2 is a cross-sectional view illustrating a multilayer semiconductor device according to a second embodiment of the present disclosure.
Figure 3:
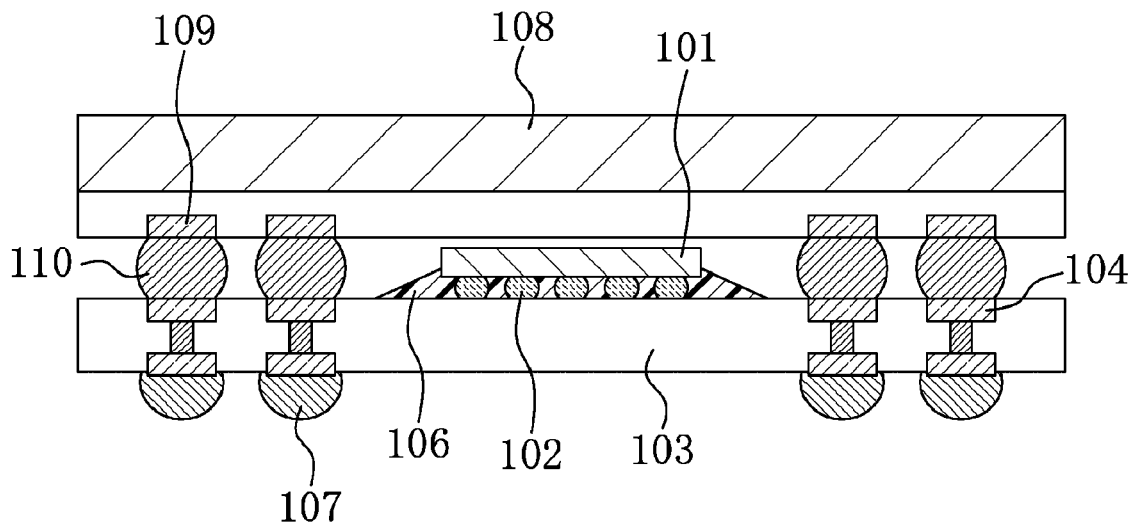
FIG. 3 is a cross-sectional view illustrating a conventional multilayer semiconductor device having a PoP structure.
Figure 4:
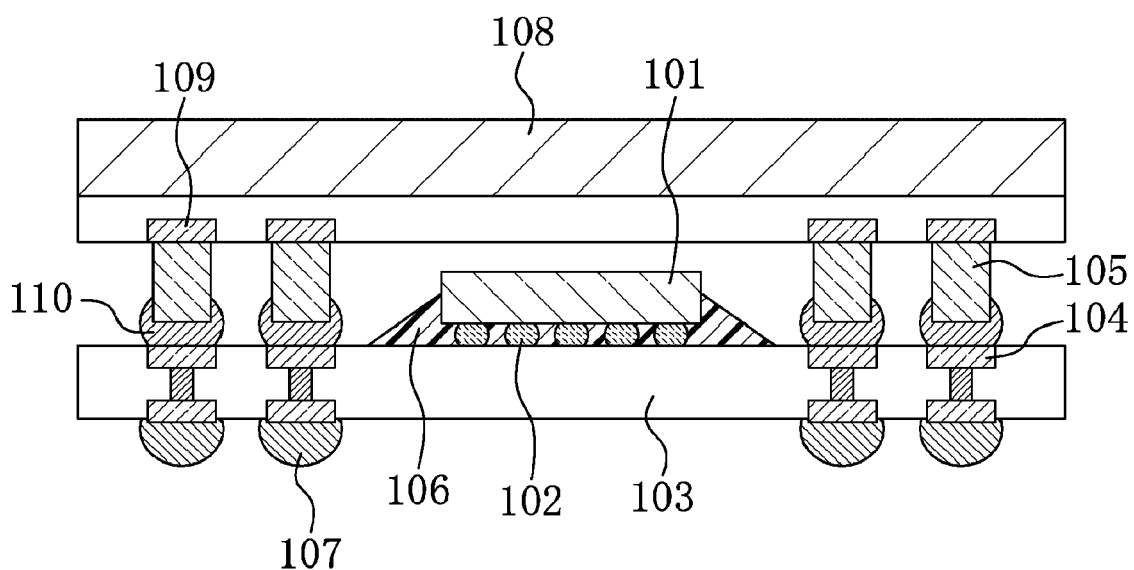
FIG. 4 is a cross-sectional view illustrating an example of a conventional multilayer semiconductor device.
Figure 5:
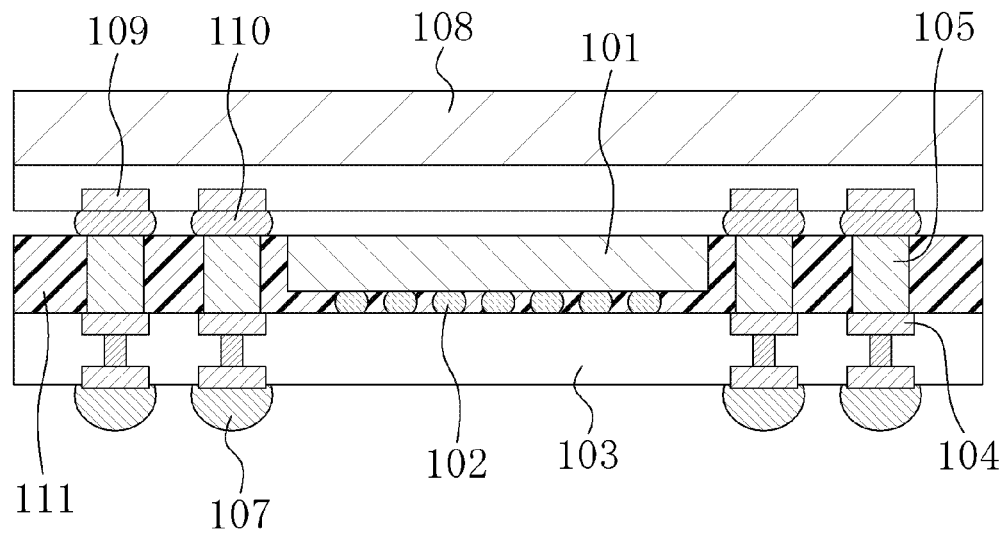
FIG. 5 is a cross-sectional view illustrating an example of a conventional multilayer semiconductor device.

FIG. 2 is a cross-sectional view illustrating a multilayer semiconductor device according to a second embodiment of the present disclosure. In the figure, the same reference characters as those shown in FIG. 1 are used to represent equivalent elements, and the explanation thereof will be omitted or simplified.

In the multilayer semiconductor device according to this embodiment, second metal posts 15 are provided between the metal balls 10 and the electrode lands 9 in the multilayer semiconductor device according to the first embodiment. The second metal posts 15 and the metal balls 10 are provided on the multilayer package 8 in advance before mounting the multilayer package 8. Note that part or whole of the side surface of each of the second metal posts 15 are exposed. Other structures are similar to those in the multilayer semiconductor device of the first embodiment, and the explanation thereof will be omitted.

In the multilayer semiconductor device according to this embodiment, the standoff between the multilayer package 8 and lower package can be more widely provided than in the multilayer semiconductor device according to the first embodiment. As a result, the limitations on the thickness of the semiconductor chip 1 and the height of the metal bumps 2 are reduced, thereby effectively reducing cracks of the semiconductor chip 1 or breaking of the metal bumps 2. Similar to the multilayer semiconductor device of the first embodiment, the size of the semiconductor chip 1 can be increased as compared to a conventional device, since the metal posts 5 are provided.

Figure 6:
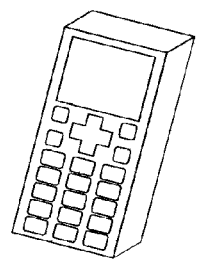
FIGS. 6A-6C are perspective views of example electronic equipments in which multilayer semiconductor devices are mounted.
Figure 6:
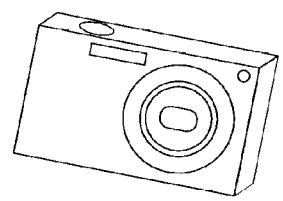
Figure 6:
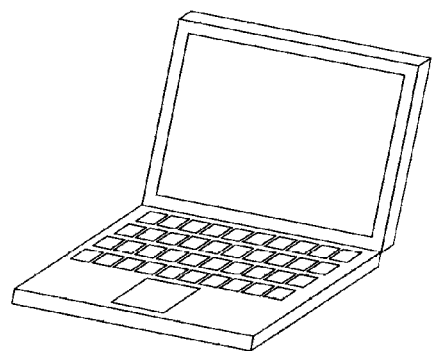

Note that the multilayer semiconductor devices described in the above embodiments can be mounted, for example, as a multistage imaging unit in communication equipments such as mobile phones as shown in FIG. 6A, digital cameras as shown in FIG. 6B, and electronic equipments such as personal computers as shown in FIG. 6C.

As described above, a semiconductor device and a method of manufacturing the device according to the present disclosure is applied to a multilayer semiconductor device having a PoP structure and is used for various electronic equipments.

What is claimed is:

1. A multilayer semiconductor device comprising:
    an interconnect substrate provided with connection terminals on a top surface;
    a semiconductor chip mounted on the top surface of the interconnect substrate;
    first connecting members connecting the interconnect substrate to the semiconductor chip;
    first metal posts provided on the connection terminals, and in a region of the top surface of the interconnect substrate outside the semiconductor chip when viewed from above; and
    encapsulating resin filling at least a space between the interconnect substrate and the semiconductor chip;
    wherein a distance between the semiconductor chip and the first metal posts is 0.1 mm or more.

2. The multilayer semiconductor device of claim 1, wherein the encapsulating resin is provided in a region from the space between the interconnect substrate and the semiconductor chip to the first metal posts, and
    part of a side surface of each of the first metal posts is exposed from the encapsulating resin.

3. The multilayer semiconductor device of claim 1, further comprising first electrode lands provided on the top surface of the interconnect substrate, and the first electrode lands are connected to the first connecting members.

4. The multilayer semiconductor device of claim 3,
    further comprising a semiconductor device provided with second electrode lands on a main surface; and
    second connecting members electrically connecting the first metal posts to the second electrode lands.

5. The multilayer semiconductor device of claim 4, wherein a circuit formation surface of the semiconductor chip faces the interconnect substrate.

6. The multilayer semiconductor device of claim 5,
    further comprising second metal posts provided between the second connecting members and the second electrode lands,
    wherein side surfaces of the second metal posts are exposed from the encapsulating resin.

* * * * *